United States Patent [19]
Bowyer et al.

[11] Patent Number: 5,982,165
[45] Date of Patent: Nov. 9, 1999

[54] RF CIRCUIT FOR USE IN A COMBINED LEAKAGE DETECTOR AND SIGNAL LEVEL MONITOR

[75] Inventors: Andrew E. Bowyer; Adam A. Nowotarski; Pingnan Shi; Qin Zhang, all of Indianapolis, Ind.

[73] Assignee: Wavetek Corporation, Indianapolis, Ind.

[21] Appl. No.: 08/767,991

[22] Filed: Nov. 29, 1996

[51] Int. Cl.$^6$ .................................................. G01R 23/04
[52] U.S. Cl. ............................ 324/95; 324/509; 324/544
[58] Field of Search .............................. 324/95, 509, 520, 324/543, 544, 551, 76.14, 76.39

[56] References Cited

U.S. PATENT DOCUMENTS

| | | | |
|---|---|---|---|
| 3,710,238 | 1/1973 | Peterson | 324/510 |
| 3,839,672 | 10/1974 | Anderson | 324/543 |
| 4,072,899 | 2/1978 | Shimp | 325/67 |
| 4,472,676 | 9/1984 | Eichmann et al. | 324/509 |
| 4,578,637 | 3/1986 | Allen et al. | 324/538 |
| 5,493,210 | 2/1996 | Orndorff et al. | 324/95 |
| 5,608,428 | 3/1997 | Bush | 348/6 |
| 5,633,582 | 5/1997 | Orndorff et al. | 324/95 |

*Primary Examiner*—Josie Ballato
*Assistant Examiner*—Russell M. Kobert
*Attorney, Agent, or Firm*—Maginot Addison & Moore

[57] ABSTRACT

An RF circuit for use as a front end for a combined leakage signal detector and signal level monitor includes a shared frequency conversion stage utilized for both leakage signals and signal level monitoring ("SLM") signals. One embodiment of the present invention includes an RF circuit comprising a first RF input, a second RF input, a frequency conversion circuit and a coupling device. The first RF input is operable to receive first signals to be monitored, the first signals being in a first frequency range. The second RF input is operable to receive leakage signals to be detected, the leakage signals also being in a first frequency range. The frequency conversion circuit is operable to convert signals in the first frequency range to signals in a second frequency range, the frequency conversion circuit operable to receive unconverted first signals and unconverted leakage signals and produce output signals therefrom. The output signals produced by the frequency conversion stage have a frequency in the second frequency range. The coupling device alternately connects the first RF input to the frequency conversion circuit and the second RF input to the frequency conversion circuit. The output signal may then be provided to a suitable measurement circuit that performs leakage signal detection or signal level monitoring using known methods.

5 Claims, 2 Drawing Sheets

RF CIRCUIT FOR USE IN A COMBINED LEAKAGE DETECTOR AND SIGNAL LEVEL MONITOR

FIELD OF THE INVENTION

The present invention relates generally to RF test instruments, and more particularly to an RF leak detector and signal level monitor for use in connection with CATV coaxial cable distribution networks.

BACKGROUND OF THE INVENTION

A Community Antenna Television ("CATV") system, or cable television system, includes at its basic elements a centralized transmitter and a distribution network. The centralized transmitter typically includes an aerial antenna for receiving radio frequency ("RF") television signals. The centralized transmitter is furthermore connected to communicate television signals to CATV subscribers through the distribution network. The distribution network includes miles of coaxial cable that often connect as many as hundreds of thousands subscribers to the centralized transmitter. The complexity and size of the distribution network require that network operation and performance be periodically tested and/or monitored.

Two tests often performed by CATV service providers are signal level monitoring and leakage detection. CATV service providers use signal level monitors to measure the signal level of particular channel frequencies at any part of the distribution network. A technician connects the signal level monitor to the coaxial cable at any location within the distribution network. The signal level monitor allows the technician to obtain data regarding the frequency response of the distribution network and identify network-related signal transmission problems.

Leakage detectors are devices that detect and/or measure the leakage of CATV signals to the exterior of the coaxial cable. If the coaxial cable is insufficiently shielded, significant levels of the CATV signals may leak to the environment surrounding the cable. Government regulations permit only a finite level of coaxial cable leakage. Leakage detectors help determine compliance with government regulations and can otherwise provide information as to the performance of particular sections of coaxial cable.

Preferably, CATV test equipment is designed to have relatively small physical size. Small physical size is preferable because the equipment must be portable as it is intended for use in various parts of the distribution network. Transportation costs are reduced and the convenience to the technician is increased when the size and bulk of the testing equipment are reduced. One way to reduce the overall bulk of test equipment is to reduce the actual number of test devices that technicians must have on hand. To reduce the quantity of test equipment needed by CATV test technicians, devices have been developed that perform multiple testing functions. For example, U.S. Pat. No. 5,493,210 to Orndorff, issued Feb. 20, 1996, filed Jun. 10, 1993, ("Orndorff") shows a combination leakage detector and signal level monitor.

The Orndorff device includes two separate input circuits, each including at least one frequency conversion stage. One input circuit is dedicated to leakage signal detection, and the other dedicated to signal level monitoring. The leakage detection input circuit includes one frequency conversion stage, while the signal level monitoring input circuit includes two frequency conversion stages. The two input circuits are then coupled to an intermediate frequency ("IF") section that further includes another frequency conversion stage. The output of the IF frequency conversion stage is a measurement circuit that performs the signal level measurement and leakage detection on the down-converted signal.

The Orndorff device has several drawbacks that impact the cost of manufacturing the product. Specifically, each frequency conversion includes elements that increase the cost of the product. The Orndorff design requires four frequency conversion stages, each of which increases the product cost. Moreover, the Orndorff design as disclosed includes an integrated circuit that houses a plurality of log amplifiers for providing gain control of the frequency converted output signal, which represents another significant portion of the cost. Finally, the Orndorff design employs crystal and ceramic filters that further increase the cost of the product.

There is a need, therefore, for a combined leakage detector and signal level monitor having reduced cost and simplified circuitry.

SUMMARY OF THE INVENTION

The present invention addresses the above and other needs by providing an RF circuit suitable for use as a front end in a combined leakage signal detector and signal level monitor. The RF circuit according to the present invention includes a shared frequency conversion stage utilized for both leakage signals and signal level monitoring ("SLM") signals. The shared frequency conversion stage reduces the overall quantity and cost of frequency conversion circuitry in the combined leakage detector and signal level monitor device.

One embodiment of the present invention includes an RF circuit for use with a combined signal level monitor and leakage detector, the RF circuit comprising a first RF input, a second RF input, a frequency conversion circuit and a coupling device. The first RF input is operable to receive first signals to be monitored, said first signals being in a first frequency range. The second RF input is operable to receive leakage signals to be detected, said leakage signals also being in a first frequency range. The frequency conversion circuit is operable to convert signals in the first frequency range to signals in a second frequency range, said frequency conversion circuit operable to receive unconverted first signals and unconverted leakage signals and produce output signals therefrom. The output signals produced by the frequency conversion stage have a frequency in the second frequency range. The coupling device alternately connects the first RF input to the frequency conversion circuit and the second RF input to the frequency conversion circuit. The output signal may then be provided to a suitable measurement circuit that performs leakage signal detection or signal level monitoring using known methods.

The present invention optionally includes a step adjustable op-amp stage that provides variable gain to the output signal. The variable gain allows the output signal to be amplitude adjusted to a preferred level for the measurement circuit, thereby allowing signals of significantly different magnitudes to be detected and measured. The present invention may also include an active filter bank to filter the output signal prior to providing the output signal to the measurement circuit.

The present invention thus provides lower cost by using a shared frequency conversion stage to perform all of the frequency conversion required by the RF circuit, as opposed to prior art designs that utilized separate frequency conversions for each of the leakage detection input signals and the signal level monitoring input signals. The optional amplifier and filters, discussed above, can also contribute to cost reduction.

The above features and advantages of the present invention, as well as others, will become more readily apparent to those of ordinary skill in the art by reference to the following detailed description and accompanying drawings.

DETAILED DESCRIPTION

Figure 1:
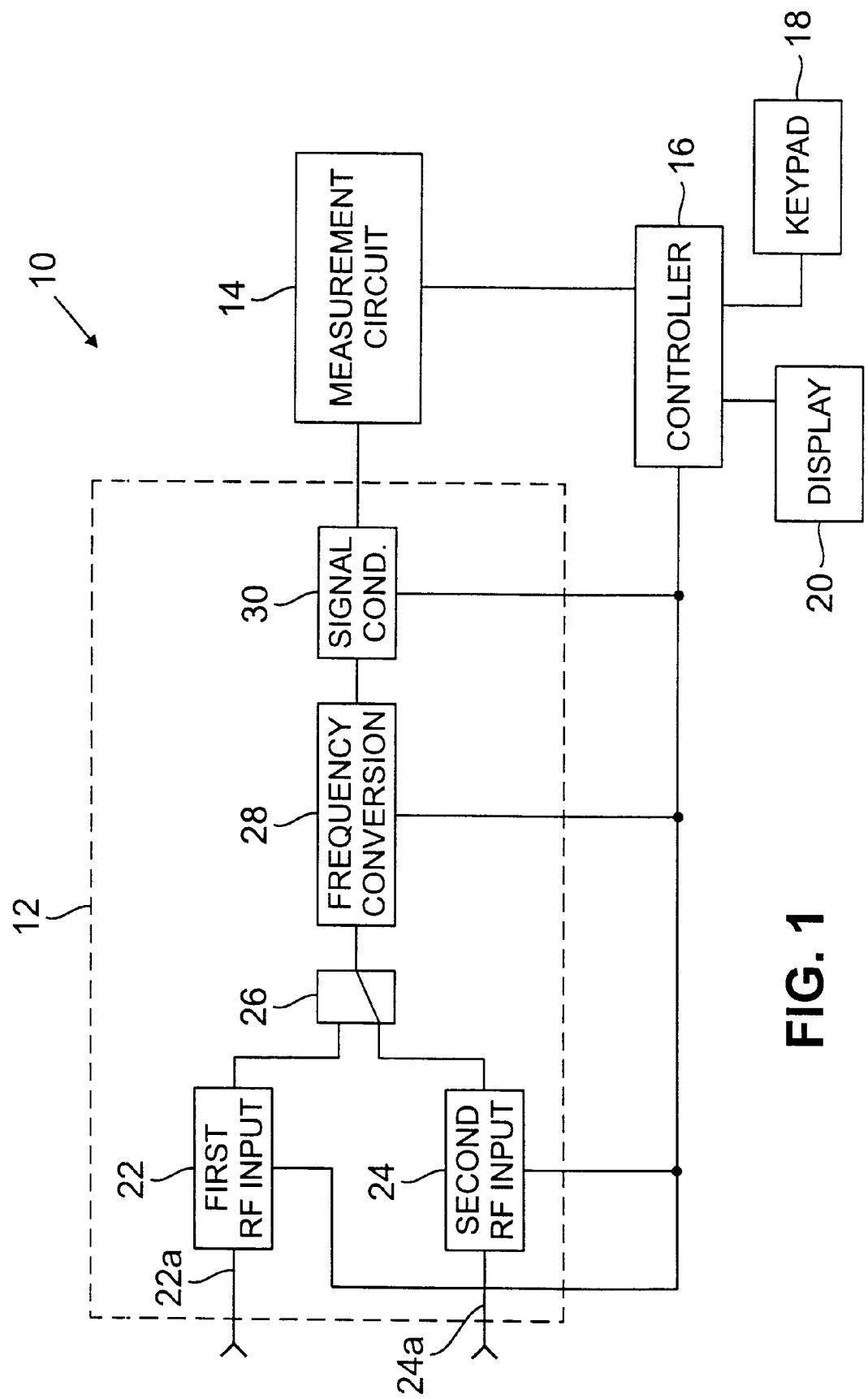
FIG. 1 shows a circuit schematic block diagram of a combined signal level monitor and leakage detector according to the present invention.

FIG. 1 shows a circuit schematic block diagram of a combined signal level monitor and leakage detector ("combined monitor/detector") 10 according to the present invention. The combined monitor/detector 10 includes an RF circuit 12, a measurement circuit 14, a controller 16, a keypad 18 and a display 20. The RF circuit 12 further includes first and second RF enters 22 and 24 respectively, a coupling device 26, a frequency conversion circuit 28 and a signal conditioner 30.

The first RF input 22 comprises an input stage that is operable to receive, and provide initial conditioning to, first input signals received through a CATV coaxial cable connection 22a. The first input signals are RF signals having a frequency in a first frequency range. In a CATV testing implementation, the first RF input 22 would be operable to receive RF signals in a frequency range between 5 MHZ and 890 MHZ. In general, the first RF input 22 provides initial conditioning to the input signals by providing amplification, filtering, and impedance matching if necessary. The first RF input 22 does not perform any frequency conversion. The first RF input 22 is connected to the coupling device 26.

The second RF input 24 comprises an input RF stage that is operable to receive, and provide conditioning to, leakage input signals received from an antenna 24a. The leakage signals are also within the first frequency range. In a CATV testing implementation, the leakage signals of interest are in a frequency band of approximately 115 MHZ to 140 MHZ. Although leakage signals exist at many frequencies, the frequency band 115 MHZ to 140 MHZ is preferable for measuring leakage signals because that frequency band is less susceptible to external RF signals that could interfere with leakage measurement accuracy. Similar to the first RF input 22, the second RF input amplifies and filters the leakage input signals. Because detected leakage signals are typically of much smaller magnitude than the first input signals receive through the CATV coaxial connection 22a, the second RF input 24 includes greater amplification than the first RF input 22. The second RF input 24 is also connected to the coupling device 26.

The frequency conversion circuit 28 includes one or more frequency conversion stages that are operable to receive RF signals in a first frequency range and convert those RF signals into signals of a second frequency range. The first frequency range includes the frequency range of all signals to be monitored and the frequency range of the leakage signals to be detected, which ranges are typically coextensive. Thus, in the CATV testing implementation discussed the first frequency range would be between 5 MHZ and 890 MHZ. The second frequency range should essentially comprise an intermediate frequency ("IF") plus some tolerance range. As a result, according to the exemplary implementation of the invention described herein, the frequency conversion circuit 28 is operable to receive signals within the first frequency range, from 5 MHZ to 890 MHZ, and produce signals in a range that is approximately equal to IF+/−0.15(IF).

The coupling device 26 may suitably be any device or circuitry that connects both the first RF input 22 to the frequency conversion circuit 28 and the second RF input 24 to the frequency conversion circuit 28 while providing isolation between the first RF input 22 and the second RF input 24. The coupling device 26 may, for example, be a diode switch, a GaAs FET switch, or a hybrid directional RF coupler.

The frequency conversion circuit 28 is operably connected to a signal conditioner 30 that provides conditioning to the IF signal received from the frequency conversion circuit 28. The conditioning circuit 30 includes amplifiers and filters that provide suitable signal levels that allow the measurement circuit to perform the appropriate signal level measurement and/or leakage signal detection.

Accordingly, the RF circuit 12 is generally operable to receive, alternately, first RF signals from a CATV coaxial cable connection 22a and RF leakage signals from an antenna 24a and provide an output signal therefrom, the output signal comprising a conditioned IF signal suitable for leakage detection and signal level monitoring analysis.

The measurement circuit 14 is connected to the signal conditioner 30. The measurement circuit 14 is a circuit that can perform both leakage signal detection and signal level monitoring. According to the present embodiment, the measurement circuit 14 includes a digital signal processing circuit that performs the measurement circuit functions. In contrast to prior art devices, the digital signal processing circuitry allows the leakage detection and signal level monitoring to be performed in the digital domain. To this end, the measurement circuit includes a digital signal processing device or circuit programmed and/or configured to perform the operations discussed further below in connection with the general description of the operation of the device. The digital signal processing ("DSP") circuit may be a 16 bit DSP device, or a combination of a field programmable gate array and a microprocessor.

Alternatively, the measurement circuit 14 may be a conventional analog measurement circuit that includes a controller. Suitable measurement circuits 14 are known. For example, the Stealth model test unit available from Wavetek Corporation in Indianapolis, Ind., includes a suitable signal level measurement circuit. Likewise, for example, U.S. Pat. No. 4,072,899 to Shimp, and U.S. Pat. No. 4,491,968 to Shimp, both of which are incorporated herein by reference, both show a leakage detection circuit. Those of ordinary skill in the art may readily incorporate a leakage detector such as those shown in the Shimp patent and the Stealth model signal level measurement circuit into a single measurement circuit. In yet another alternative, the measurement circuit 14 may suitably be the analogous measurement circuit shown in U.S. Pat. No. 5,493,210 to Orndorff, which is incorporated herein by reference. In such a case, the RF circuit from the Orndorff device may be replaced by the RF circuit 12 discussed above.

In any event, the controller 16 is operably connected to control the operations of each of the measurement circuit 14, the first RF input circuit 22, the second RF input 24, the coupling device 26, the frequency conversion circuit 28, and the signal conditioner 30. The controller 16 may suitably be a microprocessor. The controller 16 is further connected to the keyboard 18 and the display 20. The keyboard 18 provides a means for accepting user input and the display 20 provides a means of communicating results to a user. Results may also be communicated by an audible signal, including those generated using speech synthesis. Alternatively, results may be provided to a communication circuit, not shown, to facilitate the transfer of the results information to a remote device.

In operation, the user may manually select via the keypad 18 whether the combined monitor/detector 10 is to perform signal level monitoring or leakage detection.

Signal Level Monitoring

If signal level monitoring is selected, the controller 16 causes the coupling device 26 to connect the first RF input 22 to the frequency conversion circuit 28. The user typically also selects, via the keypad 18, a particular channel frequency within the CATV frequency spectrum to be monitored. The controller 16 then configures the frequency conversion circuit 28 to convert signals at the selected channel frequency to the IF signal frequency.

The first RF input 22 then receives and conditions the RF input signal that includes the selected channel frequency. The first RF input 22 conditions the RF signal and then provides the RF signal to the frequency conversion circuit 28. The frequency conversion circuit 28 performs a frequency conversion on the RF input signal such that the selected channel frequency is converted to a frequency that is approximately equivalent to the IF signal frequency. The converted input signal or IF signal is then provided to the signal conditioner which filters the IF signal, leaving predominantly just the IF signal frequency component. The resultant filtered signal is essentially a down-converted version of the selected channel frequency, referred to herein as the output signal.

The measurement circuit 14 then performs a signal level measurement using the output signal and provides the result to the controller 16, which in turn causes the result to be displayed on the display 20. To this end, the measurement circuit 14 first samples and digitizes the output signal. The DSP circuit then demodulates the output signal using digital demodulation methods. To this end, the DSP circuit takes the absolute value of the digitized output signal and then performs a digital low pass filtering method on the absolute value. The DSP circuit then performs any well known and appropriate root-mean-square ("RMS") calculation on the demodulated output signal to determine signal level data. The signal level data is then provided to the controller 16 which processes the signal level data to obtain a signal level measurement. The controller 16 takes into account any normalization or gain adjustment performed by the RF circuit 12 when determining the signal level measurement. The signal level measurement may then be displayed and/or communicated.

Leakage Detection

If leakage detection is selected, the controller 16 causes the coupling device 26 to connect the second RF input 24 to the frequency conversion circuit 28, which in turn disconnects the first RF input 22 from the frequency conversion circuit 28. The controller 16 then configures the frequency conversion circuit 28 to convert signals within the leakage signal frequency range to the IF signal frequency. In the exemplary embodiment described herein, leakage signals have a frequency range of approximately 115 MHZ to 140 MHZ.

The second RF input 24 then receives and conditions the leakage signal, to the extent there is any. The second RF input 24 conditions the leakage signal and then provides the leakage signal to the frequency conversion circuit 28. The frequency conversion circuit 28 performs a frequency conversion on the leakage signal such that the leakage signal is converted to having a frequency at approximately the IF signal frequency. The converted leakage signal, or IF signal, is then provided to the signal conditioner which filters the IF signal. The filtered IF signal consists essentially of a down-converted version of the original leakage signal, and is referred to herein as the leakage output signal.

The measurement circuit 14 then performs a leakage detection and provides the result to the controller, which in turn causes the result to be displayed on the display 20. In particular, the measurement circuit 14 may measure the level of the leakage signal, and then provide the measured leakage signal level to the controller 16. The controller 16 may then either display the measured level or compare the measured level to a threshold value.

To measure the level of the leakage output signal, the measurement circuit essentially locates the vertical sync. pulses in the leakage output signal and derives RMS leakage data therefrom. The RMS leakage data is provided to the controller 16, which processes the RMS leakage data to determine a measured leakage value. The controller 16, as above, takes into account any gain adjustment or normalization performed by the RF circuit 12 when determining the measured leakage value. The measured leakage value may then be displayed or communicated.

The operation of the measurement circuit 14 to generate the RMS leakage data is described below. Specifically, the measurement circuit 14 first samples and digitizes the leakage output signal. Then, the DSP circuit demodulates the leakage output signal. To this end, the DSP circuit takes the absolute value of the leakage output signal and then applies digital low pass filtering methods. The DSP then uses digital correlation calculations to isolate the vertical sync. pulses from the demodulated leakage output signal. The correlation calculation uses the known field frequency (e.g. 60 Hz in NTSC) of a video signal in order to isolate the vertical sync. pulses, which occur once per field. Those of ordinary skill in the art may use a fast Fourier transform or other digital correlation technique to isolate the vertical sync. pulses. For example, a time domain correlation to the field frequency may be implemented through the use of a pulse train that corresponds to the field frequency.

The DSP then collects the peak sample values of the isolated vertical sync. pulses. The DSP then averages peak values from a plurality of vertical sync. pulses over time. The averaging function helps negate the effects of any low frequency tag signal that may have been superimposed on the leakage signal when it was originated. Tag signals are low frequency amplitude modulated signals that allow leakage detectors to determine or isolate the source of the leakage signal. The DSP averages the peaks of several sync. pulses in order to average out the swings attributable to the superimposed tag signal.

Figure 2:
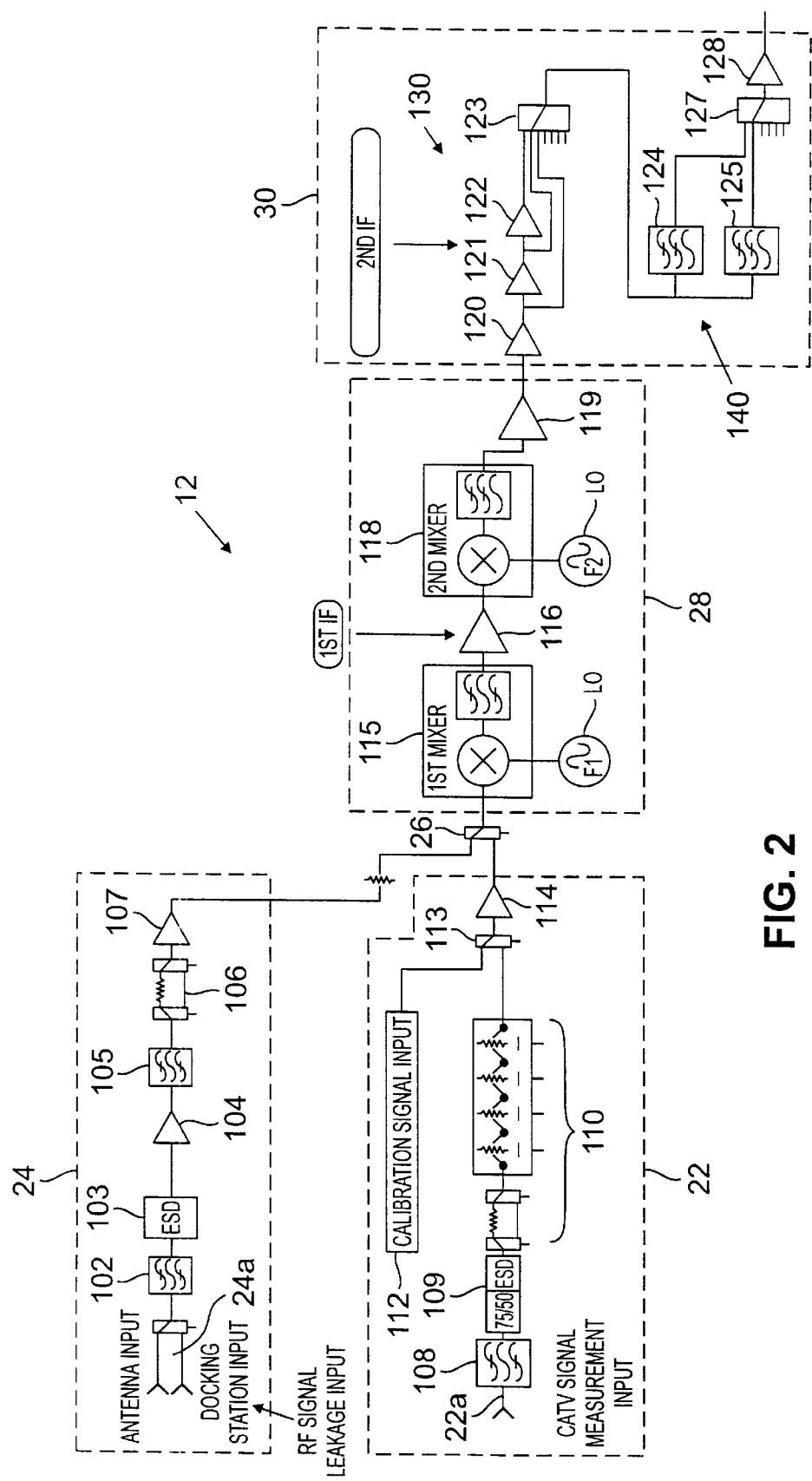
FIG. 2 shows in further detail a circuit schematic block diagram of an RF circuit for use with a combined signal level monitor and leakage detector.

FIG. 2 shows a more detailed schematic block diagram of the RF circuit 12 for use in connection with the combined monitor/detector 12. For convenience, equivalent components in FIGS. 1 and 2 are identified by the same reference numerals. The detailed circuitry of the RF circuit 12 is suitable for use in the exemplary CATV testing embodiment of the present invention.

As shown in FIG. 2, the first RF input 22 includes a bandpass filter 108, an impedance matching circuit 109, a variable attenuator 110, a calibration signal input 112, a calibration signal switch 113, and an amplifier 114. The bandpass filter 108, the impedance matching circuit 109, and the variable attenuator are serially connected. The bandpass filter 108 is further connected to the coaxial cable connection 22a.

The bandpass filter 108 is an RF filter that has a pass band consisting of the entire CATV spectrum, which is currently 5 MHZ to 890 MHZ. The impedance matching circuit 109 may suitably be any known transformer that converts the characteristic impedance of the RF circuit from 50 ohms to 75 ohms. The impedance matching circuit 109 also preferably includes an electrostatic discharge protection circuit ("ESD"). Such circuits are well known. The variable attenuator 110 includes a plurality of switchable impedance stages controlled by a controller device, not shown, which may suitably be the controller 16 of FIG. 1. The controller adjusts the attenuation provided at the RF input 22 based on the control characteristics. For example, if the input signal is very strong, the controller may increase the attenuation to reduce the amplitude of the signal to scale, or normalize, the signal into the preferred levels for carrying out the signal level monitoring measurements. Likewise, if the input signal is weak, the controller may reduce the attenuation to increase the amplitude of the signal. The controller adjusts the impedance by selectively activating the various impedance stages. In the exemplary embodiments, the variable impedance circuit includes independently actuatable stages of 23 dB, 16 dB, 8 dB, 4 dB, and 2 dB of attenuation, respectively.

The calibration signal input 112 is operable to be connected to a source of calibration signals. The calibration signals are employed to allow the controller to calibrate the circuit as necessary to compensate for the effects of temperature variation on the RF circuit devices within the RF circuit 12. The calibration signal switch 113 is an electronically controlled switch that alternatively connects the SLM signal path, in other words, the variable attenuator 110, and the calibration signal input 112 to the amplifier 114. The amplifier 114 is an RF amplifier that provides approximately 13 dB of gain. The amplifier 114 is thereafter connected to the coupling device 26.

The second RF input 24 includes the following serially connected components: a bandpass filter 102, an ESD 103, a first leakage amplifier 104, a bandpass filter 105, a variable attenuator 106, and a second leakage amplifier 107. The bandpass filter 102 is further connected to the antenna 22a, and the second leakage amplifier 107 is further connected to the coupling device 26.

The bandpass filters 102 and 105 are each RF filters having a pass band of between 115 MHZ and 140 MHZ. The ESD 103 includes any well known electrostatic discharge device, including a Schottky diode circuit intended for ESD operation. The first leakage amplifier 104 is an RF amplifier that provides approximately 12 dB of gain, and the second leakage amplifier 107 is an RF amplifier that provides approximately 31 dB of gain.

The coupling device 26 is preferably an electronically controlled RF switch, such as a diode switch or a GaAs FET switch. The coupling device 26 is further connected to the frequency conversion circuit 28. The frequency conversion circuit 28 includes the following serially connected components: a first conversion stage 115, a first IF amplifier 116, a second conversion stage 118, and a second IF amplifier 119.

Each of the conversion stages comprises a frequency conversion circuit including a mixer, a local oscillator ("LO"), and a filter. The LOs of the first and second conversion stages 115 and 118, respectively, are connected to and controlled by the controller. The first and second IF amplifiers 116 and 119 are each RF amplifiers that provide approximately 20 dB of gain.

The conditioning circuit 30 includes a variable amplification stage 130 and a variable filter stage 140. The variable amplification stage 130 includes a first, second and third op-amp amplifiers 120, 121, and 122, respectively, and a multiplexer 123. The first, second and third op-amp amplifiers 120, 121, and 122 are serially connected. The first op-amp amplifier 120 provides 20 dB of gain, the second op-amp amplifier 121 provides 6 dB of gain, and the third op-amp amplifier 122 provides 24 dB of gain. The multiplexer has inputs connected to the output of each of the first, second and third op-amp amplifiers 120, 121, and 122, respectively. The multiplexer 123 is operably connected to the controller, and may be controllably operated to connect any one of the multiplexer inputs to the multiplexer output. In this manner, the controller may select the gain provided by the variable amplification stage 130 to be either 20 dB as provided by the first op-amp amplifier 120, 26 dB as provided by the combination of the first and second op-amp amplifiers 120 and 121, or 50 dB as provided by the combination of all three op-amp amplifiers 120, 121, and 122.

The use of a step adjustable op-amp amplification stage provides cost advantages over the devices used for similar purposes in the prior art. In the prior art, variable gain in the conditioning portion of the IF circuit in a combined SLM and leakage detector was accomplished by an integrated circuit logarithmic amplifier. The step adjustable op-amp amplification stage provides similar functionality at a reduced cost.

It is to be noted that the use of a relatively low IF signal frequency of 75 KHz allows for the use of relatively inexpensive filter and amplifier components in the conditioning circuit 30. The use of a relatively low IF signal frequency allows for easier analog to digital conversion in the measurement circuit. If an analog measurement circuit is used, the IF frequency may suitably be of much higher frequencies, such as on the order of 10 MHZ. However, the filter and amplifier components may require replacement with higher frequency devices.

The variable filter stage 140 includes first and second low pass filters 124 and 125, respectively. The first low pass filter 124 has a cut off frequency at or near the system IF signal frequency. In the exemplary embodiment described herein, the IF signal frequency is approximately 75 KHz. As a result, the first low pass filter will have a cut off frequency of just above 75 KHz, such as, for example, 95 KHz.

The second low pass filter 125 has a cut off frequency that is substantially higher. While the use of a relatively low IF signal frequency of 75 KHz provides the advantages outlined above relating to component cost and digitization, the 75 KHz is lower than the high frequency components of the vertical and horizontal sync. pulses. The horizontal and vertical sync. pulses are typically used by the measurement circuit to identify and measure SLM signals in for scrambled CATV signals. Because scrambled CATV signals may often have suppressed horizontal and vertical sync. pulses, it is preferable to include many of the higher frequency components of the sync. pulses to make them easier to detect and measure. Accordingly, the second low pass filter 125 is set at a higher frequency cut off, for example, of 280 KHz in order to preserve the necessary frequency components of the horizontal and vertical sync. pulses in scrambled SLM signals.

The first and second low pass filters 124 and 125 are thereafter connected through a switch 127 to the RF circuit output 128. The RF circuit output 128 may then be connected to the measurement circuit 16 (see FIG. 1) of the combined monitor/detector 12 (see FIG. 1).

In operation, the RF circuit receives either leakage signals or SLM signals and produces therefrom normalized, amplified, filtered and down-converted output signals therefrom. Regardless of the source or strength of the received signal, the RF circuit 12 produces output signals of substantially consistent amplitude and frequency. The output signals in such a form are suitable for either SLM measurements or leakage detection.

Signal Level Monitoring

To measure SLM signals, the controller causes the coupling device 26 to connect the first RF input 22 to the frequency conversion circuit 28. The controller also causes the calibration signal switch 113 to connect the variable attenuator 110 to the amplifier 114. The controller may, after a number of SLM measurements, cause the calibration signal switch 113 to connect the calibration signal input 112 to the amplifier 114 to facilitate calibration. Ordinarily, however, the calibration signal switch 113 is configured to connect the variable attenuator 110 to the amplifier 114 to facilitate SLM measurements. In addition, the controller causes the switch 127 to connect the first low pass filter 124 to the RF circuit output 128 for measurement of unscrambled CATV channels. If a scrambled channel is to be measured, the controller causes the switch 127 to connect the second low pass filter 124 to the RF circuit output 128.

SLM signals are received through the coaxial cable connection 22a and then filtered by the bandpass filter to remove frequency components outside the CATV frequency spectrum of 5 MHZ to 890 MHZ. The variable attenuator 110 then provides attenuation to the SLM signal at a level selected by the controller. The controller selects the attenuation level based on the strength of the received signal. The controller would then factor the attenuation level into its determination of signal level.

The SLM signals then propagate through the calibration signal switch 113 to the amplifier 114, which amplifies the SLM signals by approximately 13 dB. The amplifier 114 further sets the noise factor for the SLM signals.

The first conversion stage 115 and second conversion stage 118 operate together to convert signals in a select channel frequency band to a frequency approximately equivalent to the IF signal frequency, 75 KHz. To this end, the first conversion stage 115 converts the SLM signal by mixing in a LO signal having a frequency of between 1585 and 2470 MHZ. The controller selects the LO frequency that corresponds to the channel frequency to be monitored. The first frequency conversion stage 115 converts the SLM signal such that the channel frequency to be monitored is centered around approximately 1580 MHZ. After amplification by the first IF amplifier 116, the second frequency conversion stage 118 down-converts the up-converted SLM signal by mixing in an LO frequency of approximately 1579.8 MHZ. The second frequency conversion stage 118 thus produces an IF signal in which the channel frequency to be monitored is centered around approximately 75 KHz. The second IF amplifier then adds 20 dB of gain to the IF signal and provides the amplified IF signal to the conditioning circuit 30.

In the conditioning circuit 30, the first, second and third op-amp amplifiers 120, 121, and 122 each provide a level of gain to the IF signal. As described above, the multiplexer 123 is connected to the output of each of the first, second, and third op-amp amplifiers 120, 121, and 122, and thus receives at different inputs the SLM signal amplified by: the first op-amp amplifier 120 only; the SLM signal amplified by both the first and second op-amp amplifiers 120 and 121; and the SLM signal amplified by all three op-amp amplifiers 120, 121, and 122. The controller causes the multiplexer 123 to provide a select one of the amplified SLM signals to the variable filter stage 140. The controller selects the level of amplification provided by the amplification stage in order to normalize the IF signal for measurement purposes.

The controller then causes the switch 127 to connect the first low pass filter 124 to the RF circuit output 128. The first low pass filter 124 effectively filters out frequency components above 95 KHz, and therefore only the down-converted and normalized version of the channel frequency of interest is provided to the RF circuit output 128.

Leakage Detection

For leakage detection, the controller causes the coupling device 26 to connect the second RF input 24, an in particular, the amplifier 107 to the frequency conversion circuit 28. The controller also causes the switch 127 to connect the first low pass filter 124 to the RF circuit output 128. The RF circuit 12 receives leakage RF signals through the antenna 24a and normalizes, amplifies, filters and down-converts the leakage signals such that any detected leakage signals are converted to a normalized signal having a frequency of approximately 75 KHz. Although true leakage may occur at any frequency of the CATV spectrum, only the frequencies between 115 MHZ and 140 MHZ are required to be tested to determine leakage. Accordingly, the RF circuit 12 provides an output leakage signal at the RF circuit output 128 that consists of the down-converted and normalized version of the leakage signals detected by the antenna that are between 115 MHZ and 140 MHZ.

The leakage signals are received by the antenna 24a and filtered by the bandpass filter 102. The filter 102 substantially filters out frequency components outside the 115 MHZ to 140 MHZ band. The amplifier 104 provides an initial 12 dB of gain and sets the noise factor of the leakage signal at 4 dB. A second bandpass filter 105 again filters out components outside of the 115 MHZ and 140 MHZ band ("leakage band"). The resultant filtered and amplified leakage signal then passes through the attenuator 106 which provides either no attenuation or 23 dB of attenuation, depending on the amplitude of the detected leakage signal. If the leakage signal is of relatively large magnitude, the controller will cause the attenuator 106 to provide 23 dB of attenuation. If, however, the leakage signal is relatively small in magnitude, the controller will cause the attenuator 106 to provide no attenuation.

In any event, the amplifier 107 thereafter provides 31 dB of amplification to the leakage signal. The leakage signal then propagates through the coupling device 26 to the frequency conversion stage 28. The frequency conversion stage 28 down-converts the leakage signal in the leakage band to a signal centered approximately at 75 KHz. To this end, the frequency conversion stage operates essentially in the same manner as described above in connection with signal level monitoring. The only difference in the operation of the frequency conversion stage 28 for leakage detection is that the first and second frequency conversion stages 115 and 118 are configured to down-convert signals in the leakage band, as opposed to a select channel frequency, to the IF signal frequency.

The frequency conversion circuit 28 thus produces an IF leakage signal that comprises the down-converted leakage signal. The frequency conversion circuit 28 provides the IF leakage signal to the conditioning circuit 30, and in particular, to the amplification stage 130. The amplification stage 130, under the control of the controller, provides a select one of three levels of gain to the IF leakage signal. As described above in connection with SLM, the controller selects a level of gain that will facilitate measurement by the measurement circuit, and thereby provides a normalization function. The controller then incorporates the selected level of gain into its leakage detection and evaluation functions.

Once the amplification stage 130 provides the selected level of amplification, the IF leakage signal is provided to the variable filter stage 140. As discussed above, the controller has caused the switch 127 to connect the first low pass filter 124 to the RF circuit output 128. The first low pass filter 124 filters the IF leakage signal at a cut-off frequency of approximately 95. The IF leakage signal then propagates to the RF circuit output 128.

The RF circuit 12 thus provides conversion of either SLM signals or leakage signals to an IF signal having a frequency centered around approximately 75 KHz. The RF circuit 12 provides multiple means by which the amplitude of the SLM signals and leakage signals may be adjusted to normalize the signals for measurement. As a result, a measurement circuit need only have resolution and accuracy in a single range, for example, from 0 to 5 volts peak to peak, regardless of the strength of the input signal.

It will be appreciated that the above descriptions and embodiment are given by way of example only. Those of ordinary skill in the art may readily devise their own implementations that incorporate the features of the present invention and fall within the spirit and scope thereof. For example, the specific circuit elements and arrangement of circuit elements discussed above in connection with FIG. 2 are given by way of example only and may readily be reconfigured by those of ordinary skill in the art to provide the inventive features.

We claim:

1. A combined signal level meter and leakage detector comprising:
   a) A first RF input operable to receive first signals to be monitored, said first signals being in a first frequency range;
   b) a second RF input operable to receive leakage signals to be detected, said leakage signals being in a first frequency range;
   c) a frequency conversion circuit, said frequency conversion circuit operable to receive first signals and leakage signals and produce output signals therefrom, said output signals being in a second frequency range;
   a digitizing circuit said output signals, said digitizing circuit operable connected to said frequency conversion circuit, said digitizing circuit operable to produce a digital leakage signal;
   e) a digital signal processing circuit operably connected to said digitizing circuit, said digital signal processing circuit operable to:
   generate signal level data from said output signals when said output signals are generated from first signals;
   generate leakage signal data from said output signals when said output signals are generated from leakage signals; and
   provide said signal level data and leakage signal data to a display mechanism.

2. The combined signal level meter and leakage detector of claim 1 wherein the frequency conversion circuit comprises first and second serially connected frequency conversion stages.

3. The combined signal level meter and leakage detector of claim 1 wherein the frequency conversion circuit includes at least one frequency conversion stage, each frequency conversion stage comprising a mixer and a local oscillator.

4. The combined signal level meter and leakage detector of claim 1 wherein the first RF input includes a bandpass filter, an impedance matching circuit, and an attenuator coupled in a serial manner.

5. The combined signal level meter and leakage detector of claim 1 wherein the second RF input includes a bandpass filter and an amplifier.

* * * * *